(12) United States Patent
Peng (10) Patent No.: US 7,580,498 B2
(45) Date of Patent: Aug. 25, 2009

(54) CLOSED LOOP CONTROL SYSTEM AND METHOD OF DYNAMICALLY CHANGING THE LOOP BANDWIDTH

(75) Inventor: Chi-Yuan Peng, Taipei (TW)

(73) Assignee: Via Technologies, Inc., Taipei (TW)

( * ) Notice: Subject to any disclaimer, the term of this patent is extended or adjusted under 35 U.S.C. 154(b) by 596 days.

(21) Appl. No.: 11/419,018

(22) Filed: May 18, 2006

(65) Prior Publication Data

US 2007/0268828 A1 Nov. 22, 2007

(51) Int. Cl.
*H03D 3/24* (2006.01)
(52) U.S. Cl. .................. 375/376; 375/375; 375/373; 375/327; 331/17; 327/147; 327/156
(58) Field of Classification Search ......... 375/373–376, 375/326, 327; 327/147, 156; 331/17
See application file for complete search history.

(56) References Cited

U.S. PATENT DOCUMENTS 4,506,233 A * 3/1985 Englund, Jr. .................. 331/17
7,042,972 B2 * 5/2006 Fahim ........................ 375/376

* cited by examiner

*Primary Examiner*—Phuong Phu
(74) *Attorney, Agent, or Firm*—Thomas, Kayden, Horstemeyer & Risley (57) ABSTRACT

The invention provides a method for dynamically changing the loop bandwidth of a closed loop control system. At least one loop bandwidth parameter controls the loop bandwidth of the closed loop control system. An error signal reflecting the convergence status of the output signal of the closed loop control system is first detected. The at least one loop bandwidth parameter is then dynamically adjusted according to the error signal to change the loop bandwidth of the closed loop control system. A feedback signal of the closed loop control system is then generated according to the loop bandwidth. Finally, an input signal of the closed loop control system is compensated with the feedback signal to generate the output signal.

23 Claims, 8 Drawing Sheets

Loop Bandwidth State Table

| state | loop bandwidth | threshold value | loop bandwidth parameter value | | | |
|---|---|---|---|---|---|---|
| | | | parameter A | parameter B | ........ | parameter X |
| $S_1$ | $B_1$ | $T_1$ | $A_1$ | $B_1$ | ........ | $X_1$ |
| $S_2$ | $B_2$ | $T_2$ | $A_2$ | $B_2$ | ........ | $X_2$ |
| ........ | ........ | ........ | ........ | ........ | ........ | ........ |
| $S_N$ | $B_N$ | $T_N$ | $A_N$ | $B_N$ | ........ | $X_N$ |

CLOSED LOOP CONTROL SYSTEM AND METHOD OF DYNAMICALLY CHANGING THE LOOP BANDWIDTH

BACKGROUND OF THE INVENTION

1. Field of the Invention

The invention relates to a closed loop control system, and more particularly to the loop bandwidth of a closed loop control system.

2. Description of the Related Art

Automatic Frequency Control (AFC) is a common mechanism used in wireless communication systems. AFC eliminates the frequency offset error between a transmitter side and a receiver side, which mainly results from component mismatchimg and inaccuracy, different operating environments, or the Doppler channel effect. The frequency offset error is undesirable in the receiver system, because a small frequency offset error may cause severe system performance degradation.

There are two main considerations to the performance of an AFC mechanism. One is the convergence speed, which is how fast the frequency offset error can be reduced by AFC mechanism to an acceptable level. The other is the residual frequency offset amount after AFC has acquired most of the frequency of the transmitter side, wherein the residual frequency offset amount is the minimized level of the frequency offset error and represents the stability of the output signal of the closed loop control system. Both considerations are important in AFC design. There is, however, a tradeoff between the convergence speed and the output signal stability in ordinary AFC mechanisms. The higher the convergence speed, the lower the output signal stability. The reasons for this are provided in the following.

Figure 1:
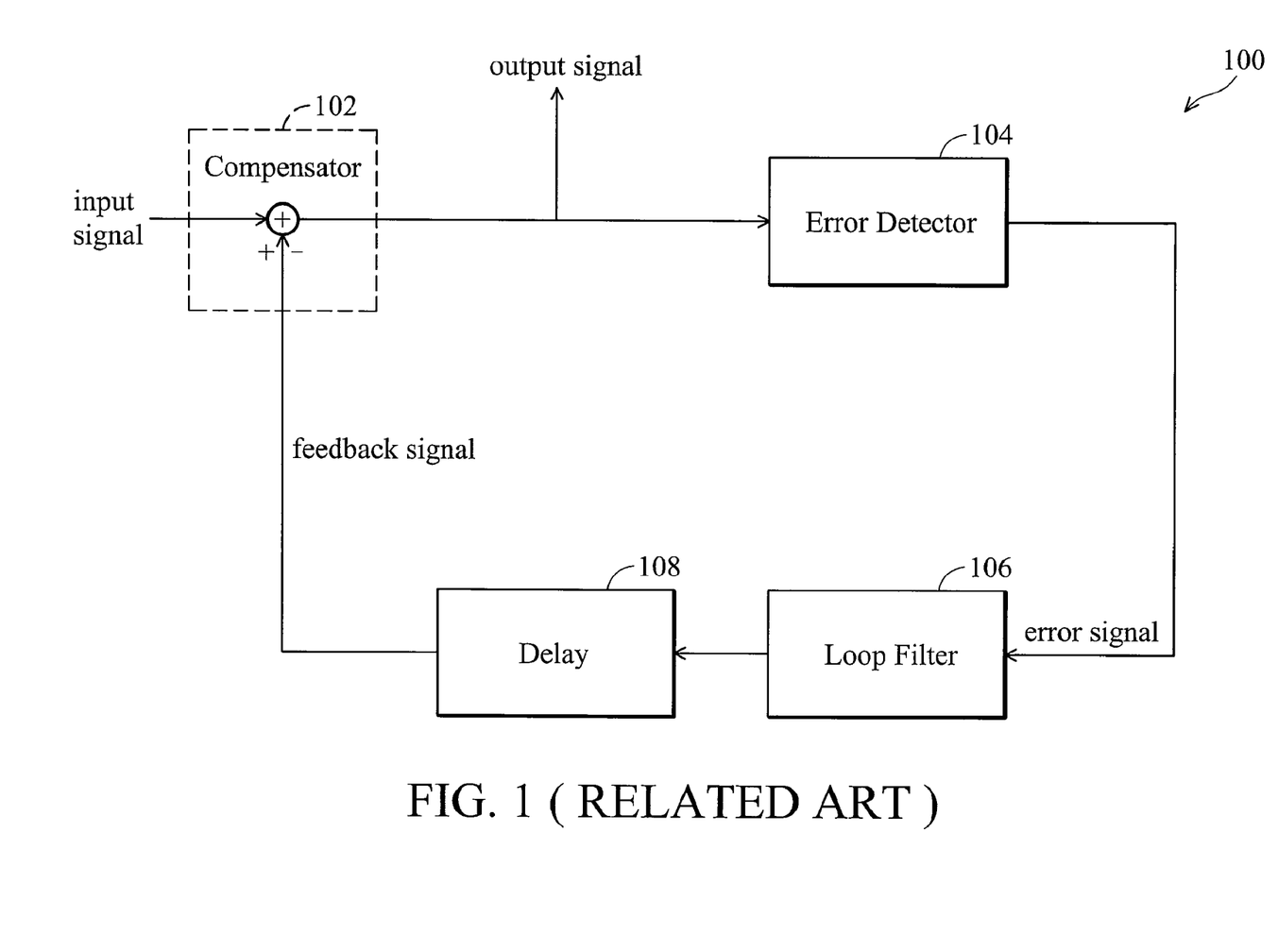
FIG. 1 is a block diagram depicts a closed loop control system.

FIG. 1 is a closed loop control system 100, which is generally used to implement an AFC mechanism. The closed loop control system 100 includes a compensator 102, an error detector 104, a loop filter 106, and a delay module 108. The input signal of the closed loop control system is first processed with a reference target signal (not shown in the FIG. 1) by the error detector 104 to generate an error signal. In an ordinary closed loop control system 100, the reference target signal may be the feedback signal from the feedback loop or the output signal of the closed loop control system 100, and the error signal may be the difference between the input signal and the reference target signal. Thus, the error signal reflects the convergence status of the output signal of the closed loop control system 100.

The error signal is then delivered to a loop filter 106, which filters the error signal in the feedback loop to generate a feedback signal. The delay module 108 then delays the feedback signal to mimic a practical closed loop with fixed loop latency. The compensator 102 then compensates the input signal of the closed loop control system 100 with the feedback signal to generate the output signal of the closed loop control system 100. The closed loop control system 100 can be a phase locked loop (PLL) or a frequency locked loop (FLL).

Figure 2:
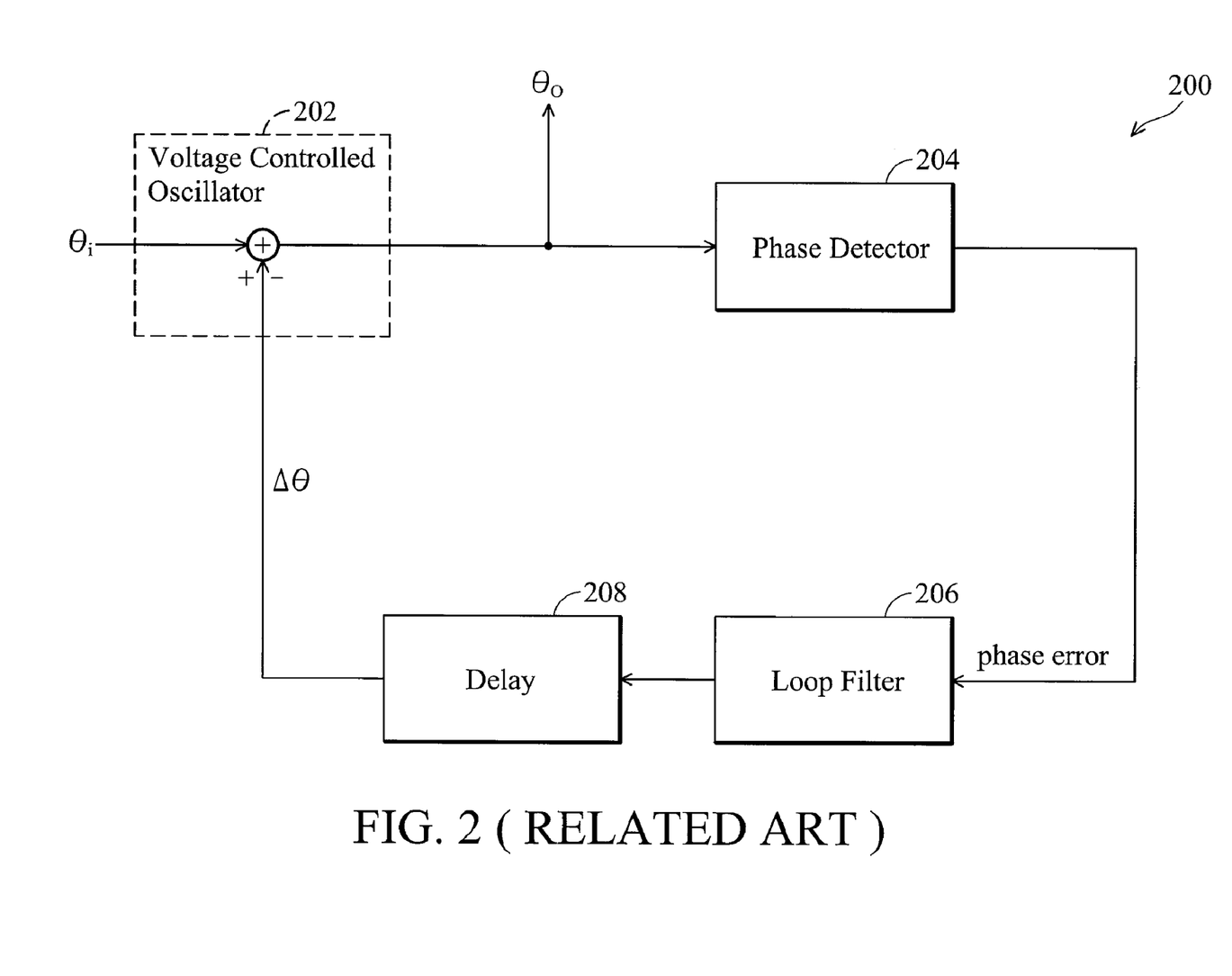
FIG. 2 is a block diagram shows a phase locked loop system.
Figure 3:
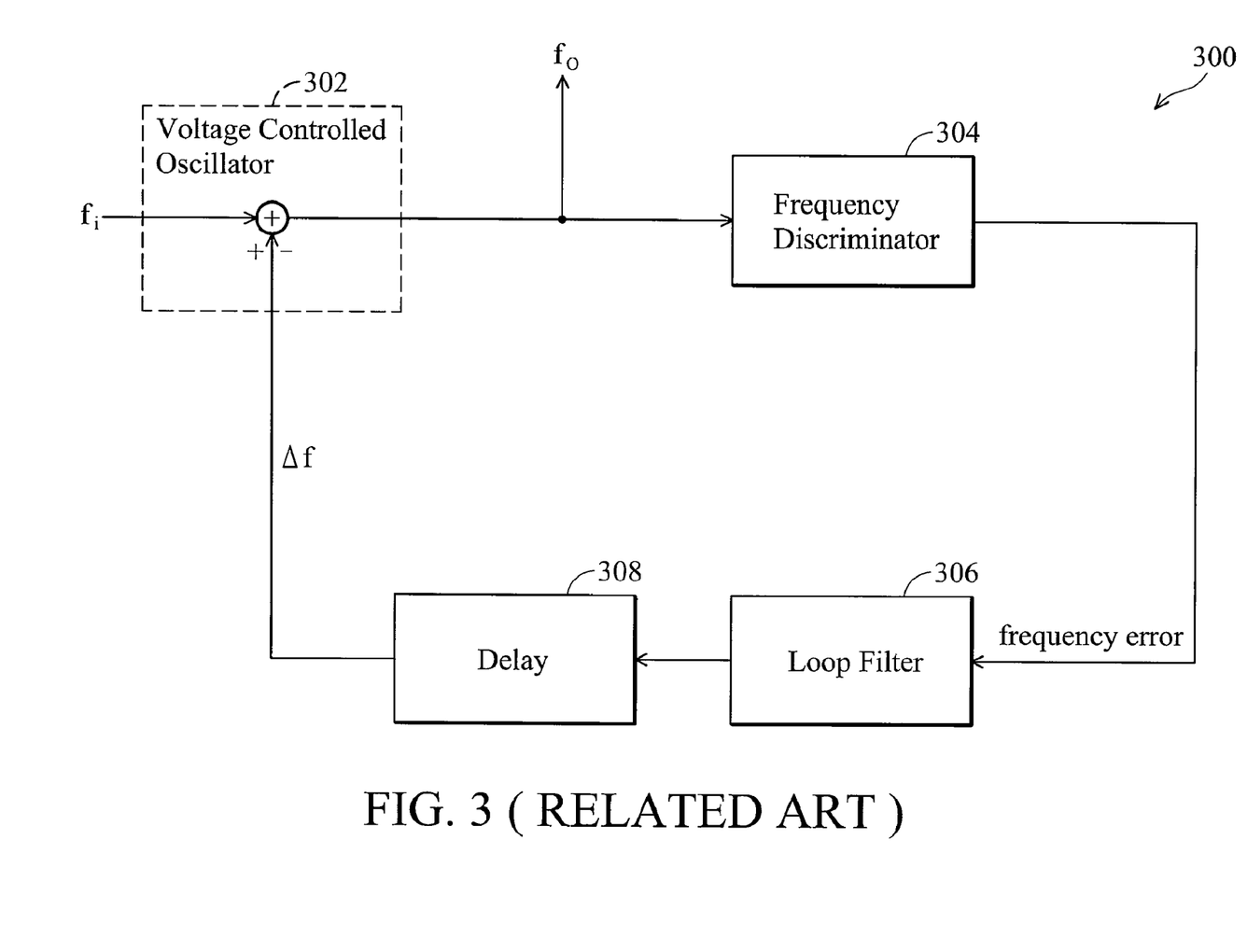
FIG. 3 is a block diagram shows a frequency locked loop system.

FIG. 2 and FIG. 3 respectively show a phase locked loop system 200 and a frequency locked loop system 300. The input signal of the PLL system 200 is a phase signal $\theta i$, and the output signal of the PLL system 200 is a phase signal $\theta o$. The phase detector 204 detects the phase error, and the loop filter 206 generates a feedback signal $\Delta\theta$ with the phase error. The voltage controlled oscillator 202 then compensates the input signal $\theta i$ with the delayed feedback signal $\Delta\theta$ to generate the output signal $\theta o$. Accordingly, The input signal of the FLL system 300 is a frequency signal fi, and the output signal of the FLL system 300 is a frequency signal fo. The frequency discriminator 304 detects the frequency error, and the loop filter 306 generates a feedback signal $\Delta f$ with the frequency error. The voltage controlled oscillator 302 then compensates the input signal fi with the delayed feedback signal $\Delta f$ to generate the output signal fo.

A main characteristic of the loop filter 106 is its loop bandwidth, which represents the filtered amount of the input signal to form the feedback signal. When the loop bandwidth is larger, the filtered range of the feedback signal is larger. Thus, when the output signal is compensated with the feedback signal, the output signal rapidly reaches steady state. In other words, the convergence speed of the closed loop control system is faster. Because the loop bandwidth is fixed, however, the feedback signal cannot be precisely adjusted when the output signal is steady, and the output signal is less stable. On the contrary, when the loop bandwidth is smaller, the filtered range of the feedback signal is smaller. When the output signal is steady, the stability of the output signal is higher, but the output signal more slowly reaches steady state. In other words, the convergence speed of the closed loop control system is lower. Thus, there is a tradeoff between the convergence speed and the output signal stability in ordinary closed loop control systems.

To solve this problem, the invention provides a method for dynamically changing the loop bandwidth of a closed loop control system. The signal convergence process of a closed loop control system can be classified into two phases. When the compensating process first begins, the output signal is not yet fully compensated, and the error signal is quite large. This phase is called "acquisition state". In this phase, the loop bandwidth should be large enough to reduce the error signal to a tolerable level as rapidly as possible. Thus, the system waiting time can be minimized, and the convergence speed is more important than the output signal stability in this phase. When the loop is almost converged, the output signal reaches the steady state and can be further processed. This phase is called "tracking state". In this phase, the loop bandwidth should be small enough to finely adjust the feedback signal, and a more stable output signal is generated. Thus, the error signal can be minimized, and the output signal stability is more important than the convergence speed in this phase. Thus, the invention combines both the advantages of fast convergence speed and high output signal stability.

BRIEF SUMMARY OF THE INVENTION

The invention provides a method for dynamically changing the loop bandwidth of a closed loop control system. At least one loop bandwidth parameter controls the loop bandwidth of the closed loop control system. An error signal reflecting the convergence status of the output signal of the closed loop control system is first detected. The at least one loop bandwidth parameter is then dynamically adjusted according to the error signal to change the loop bandwidth of the closed loop control system. A feedback signal of the closed loop control system is then generated according to the loop bandwidth. Finally, an input signal of the closed loop control system is compensated with the feedback signal to generate the output signal.

The invention also provides a closed loop control system. At least one loop bandwidth parameter controls a loop bandwidth of the closed loop control system. The closed loop control system comprises: an error detector, for detecting an error signal reflecting the convergence status of the output signal of the closed loop control system; a loop filter, coupled to the error detector, for filtering the error signal to generate a feedback signal of the closed loop control system according to a loop bandwidth; a convergence status check unit, coupled to the error detector and the loop filter, for dynamically adjusting at least one loop bandwidth parameter according to the error signal to change the loop bandwidth of the closed loop control system, wherein the at least one loop bandwidth parameter controls the loop bandwidth; and a compensator, coupled to the loop filter, for compensating an input signal of the closed loop control system with the feedback signal to generate the output signal.

The invention provides a convergence status check unit for dynamically adjusting a loop bandwidth of a closed loop control system. A plurality of states corresponding to different amount of loop bandwidth is arranged in advance. The convergence status check unit comprises: a state controller, for selecting an appropriate state of the closed loop control system from the plurality of states according to an error signal reflecting the convergence status of the output signal of the closed loop control system; and a parameter table, coupled to the state controller, for determining appropriate values of at least one loop bandwidth parameter according to the appropriate state, wherein the at least one loop bandwidth parameter controls the loop bandwidth. The at least one loop bandwidth parameter is then set with the appropriate values to switch the loop bandwidth of the closed loop control system to an appropriate loop bandwidth corresponding to the appropriate state.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 4:
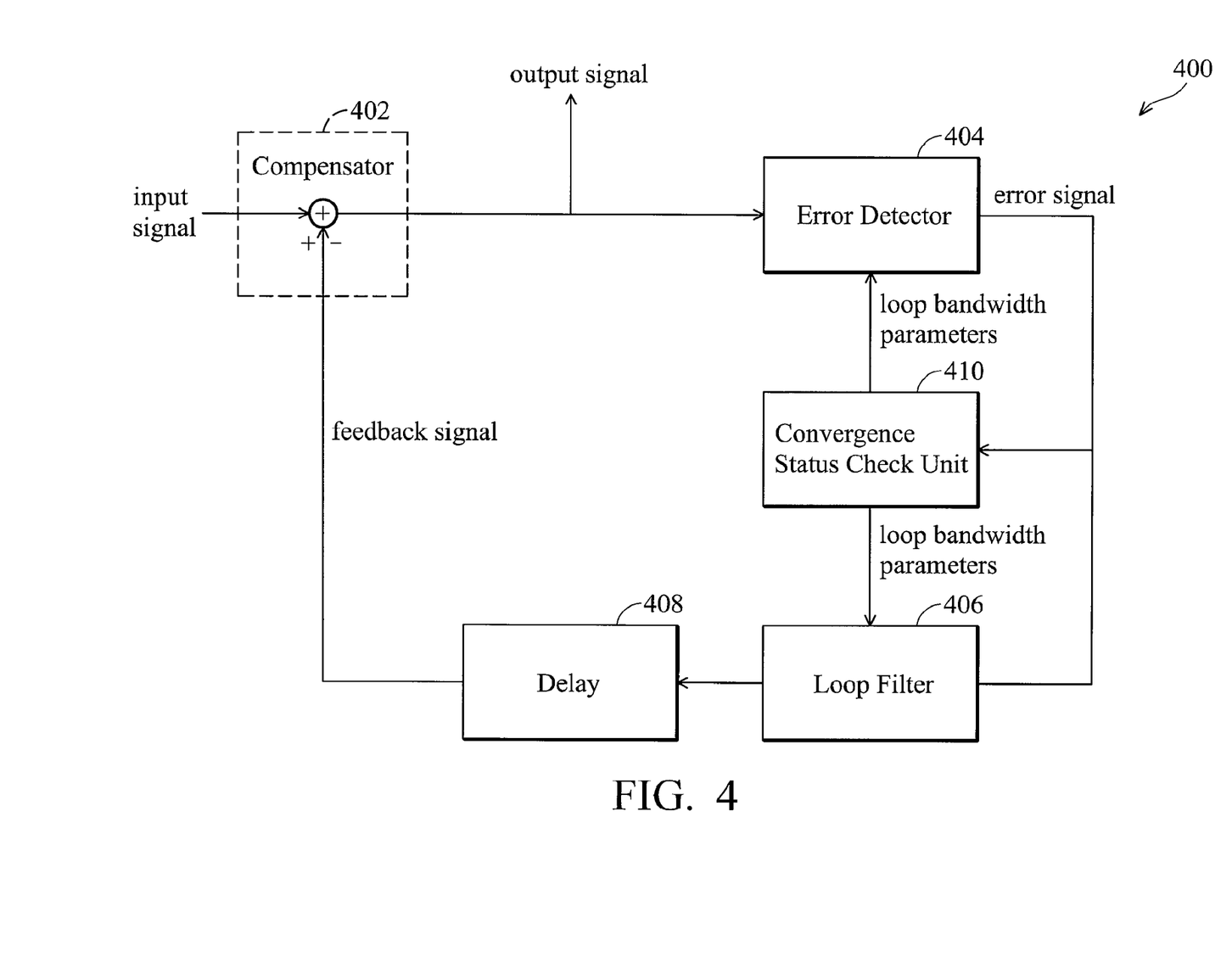
FIG. 4 is a block diagram of a closed loop control system of an embodiment in accordance with the invention.

FIG. 4 is a closed loop control system 400 according to the invention. Most components of the closed loop control system 400 resembles the closed loop control system 100, except for the loop bandwidth of the closed loop control system 400 can be dynamically changed. The closed loop control system 400 comprises a compensator 402, an error detector 404, a loop filter 406, a delay module 408, and a convergence status check unit 410. The error detector 404 first detects an error signal reflecting the convergence status of the system 400. The convergence status check unit 410 then dynamically adjusts value of at least one loop bandwidth parameter to change the loop bandwidth of the system 400 according to the error signal. The loop bandwidth parameters may be input parameters of the loop filter 406 and/or the error detector 404 and control the loop bandwidth of the system 400. Because the loop bandwidth has been changed by the convergence status check unit 410, the loop filter 406 then filters the error signal to generate a feedback signal of the system 400 according to the adjusted loop bandwidth. The compensator 402 then compensates the input signal of the system 400 with the delayed feedback signal, provided by the delay module 408, to generate the output signal. Because the loop bandwidth of the system 400 can be dynamically changed according to the convergence status of the output signal, the system 400 combines both the advantages of fast convergence speed and high output signal stability.

The error signal reflects the convergence status of the output signal of the system 400. Thus, the convergence status check unit 410 uses the error signal for monitoring the convergence status of the output signal and judges whether the loop is converged. The input signal of the convergence status check unit 410 is not necessarily the error signal output from the error detector 404. In addition to the phase error signal of the PLL system 200 and the frequency error signal of FLL system 300, any signal reflecting the convergence status can be used as the input signal of the convergence status check unit 410. For example, the signals generated by the internal nodes of the loop filter 406 could be utilized by the convergence status check unit 410. There may be multiple loop bandwidth states stored in the convergence status check unit 410 in advance; each state corresponds to a different amount of loop bandwidth and at least one loop bandwidth parameter. The convergence status check unit 410 compares the error signal with multiple threshold values corresponding to the states to determine an appropriate state, and the at least one loop bandwidth parameter is then set with the given value corresponding to the appropriate state. Thus, the loop bandwidth of system 400 is changed according to the appropriate state, which is determined by signal convergence status.

The states stored in the convergence status check unit 410 includes at least one acquisition state and one tracking state. In this case, the loop bandwidth parameters are first set with the values corresponding to the acquisition state, and then set with the values corresponding to the tracking state when the convergence status meets the threshold value corresponding to the tracking state. However, there can be more than one states applied to the signal convergence process. If the multiple states are sequentially applied to the convergence process of the closed loop control system, the loop bandwidths corresponding to the states should progressively decrease with the order of the states, because the importance of the output signal stability progressively increases and the convergence speed progressively decreases.

Figure 5:
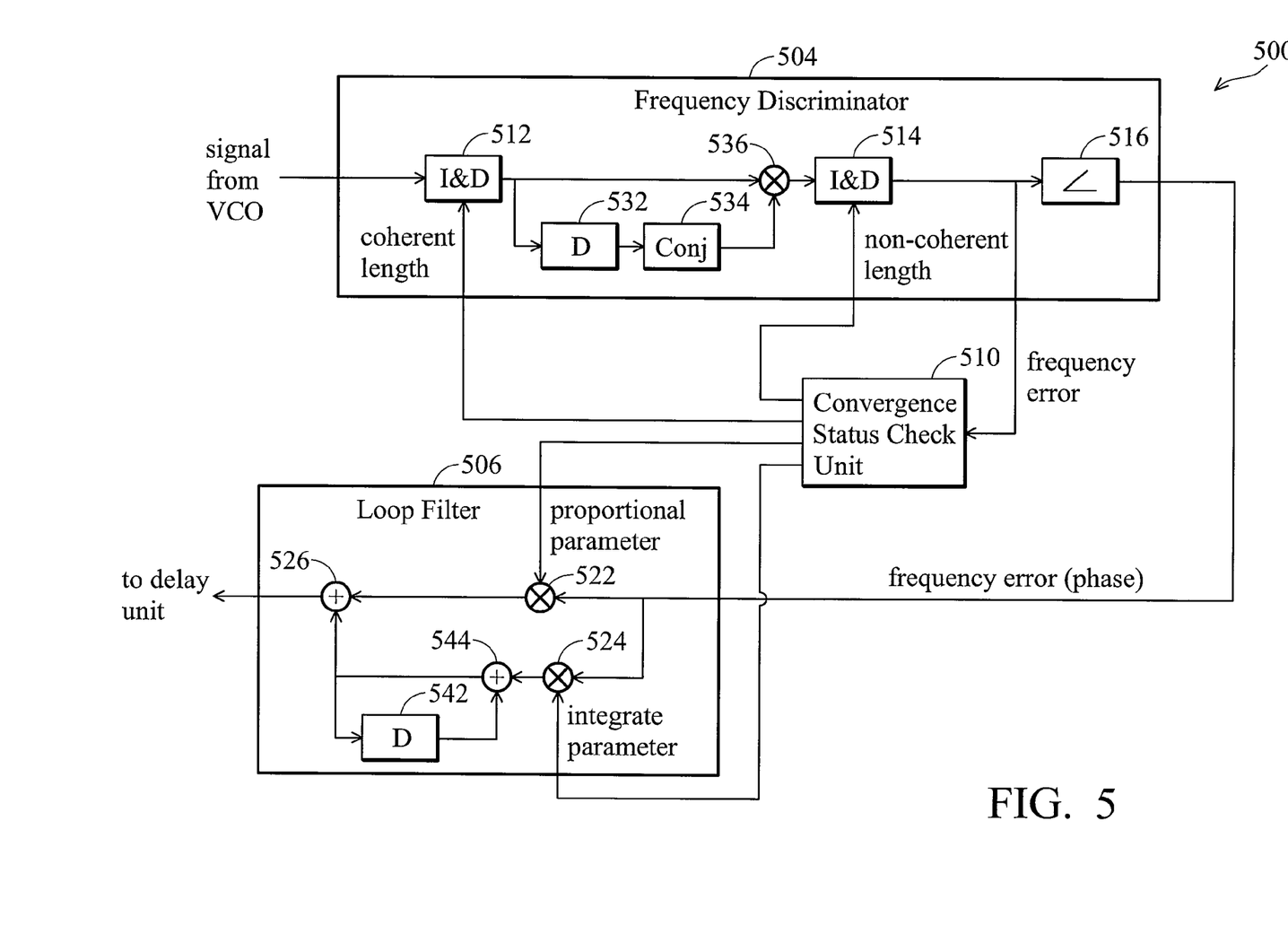
FIG. 5 is a block diagram of part modules of a frequency locked loop system according to the invention.

FIG. 5 is a block diagram of several modules of a frequency locked loop system 500 according to the invention. The frequency locked loop system 500 comprises a frequency discriminator 504, a loop filter 506, and a convergence status check unit 510. The frequency discriminator 504 includes two integrate and dump (I&D) modules 512 and 514. The former I&D module 512 controls the coherent length of the input symbols, and the later I&D module 514 controls the non-coherent length of the input symbols. The input signal is delivered to the former I&D module 512 which integrates and dumps the input signal. The signal output from the former I&D module 512 is then delivered to the delay module 532 and the conjugate module 534, wherein the delay module 532 delays the signal and the conjugate module 534 calculates the conjugate of the signal. The signals output by the former I&D module 512 and the conjugate module 534 are then multiplied by the multiplier 536 to generate a product signal, and the product signal is further integrated by the later I&D module 514 to generate a frequency error signal, which is received by the convergence and status check unit 510 as an input signal. The phase angle of the frequency error signal is extracted by phase angle module 516 and delivered to the loop filter 506 as its input signal.

Because both the coherent length of the I&D module 512 and the non-coherent length of the I&D module 514 can increase the signal to noise ratio (SNR) and further decrease the loop bandwidth, the convergence status check unit 510 can adjust the coherent length of the I&D module 512 and/or the non-coherent length of the I&D module 514 to change the loop bandwidth. In other words, the loop bandwidth parameters may include the coherent length of the I&D module 512 and the non-coherent length of the I&D module 514.

The loop filter 506 is a proportional-integration (PI) type filter. When the frequency error signal generated by frequency discriminator 504 is delivered to the loop filter 506, the current frequency error signal is multiplied with a proportional parameter by a multiplier 522 to generate a proportional part. The previous frequency error signal is multiplied with an integrated parameter by a multiplier 524, and then delayed and accumulated by a delay cell 542 and an adder 544 to generate an integrated part. The proportional part and the integrated part are added together to generate the feedback signal by an adder 526. Because both the proportional parameter and the integrated parameter affect the loop bandwidth of the system 500, the convergence status check unit 510 can also adjust the proportional parameter and the integrated parameter of the loop filter 506 to change the loop bandwidth. In other words, the loop bandwidth parameters may include the proportional parameter and the integrated parameter of the loop filter 506.

Figure 6:
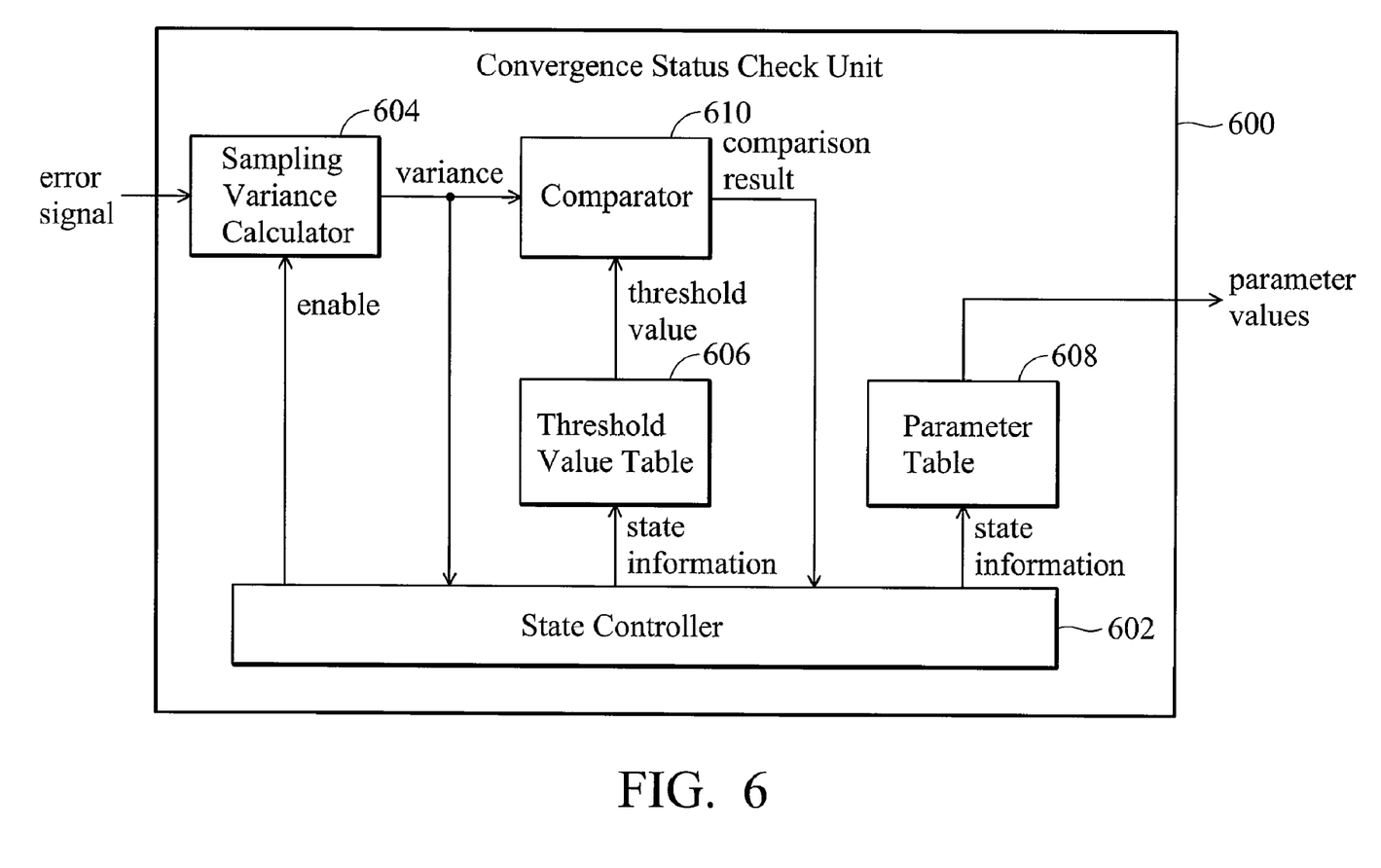
FIG. 6 is a block diagram of a convergence status check unit according to the invention.

FIG. 6 is a block diagram of a convergence status check unit 600 according to the invention. The convergence status check unit 600 comprises a state controller 602, a sampling variance calculator 604, a threshold value table 606, a parameter table 608, and a comparator 610. After being enabled by the state controller 602, the sampling variance calculator 604 first calculates a variance of the error signal, which represents an average convergence status of the sampled error signal over a predetermined period. The state controller 602 determines the appropriate state according to the variance, i.e., the signal convergence status, and notifies the threshold value table 606 and parameter table 608 of the current appropriate state. The threshold value table 606 stores multiple threshold values corresponding to the multiple states, as shown in the column 706 of loop bandwidth state table 700 of FIG. 7. When the threshold value table 606 receives the current state from the state controller 602, the threshold value table 606 determines a threshold value corresponding to the current state, and the comparator 610 compares the variance with the threshold value to generate a comparison result. The state controller 602 then determines whether to change the current state according to the comparison result. For example, if the variance of the error signal is smaller than the threshold value corresponding to the current state, the convergence status has been improved, and the state controller 602 triggers a new state to decrease the loop bandwidth. Otherwise, if the variance is larger than the threshold value corresponding to the current state, the loop has not yet been converged, and the current state will not be changed.

Figure 7:
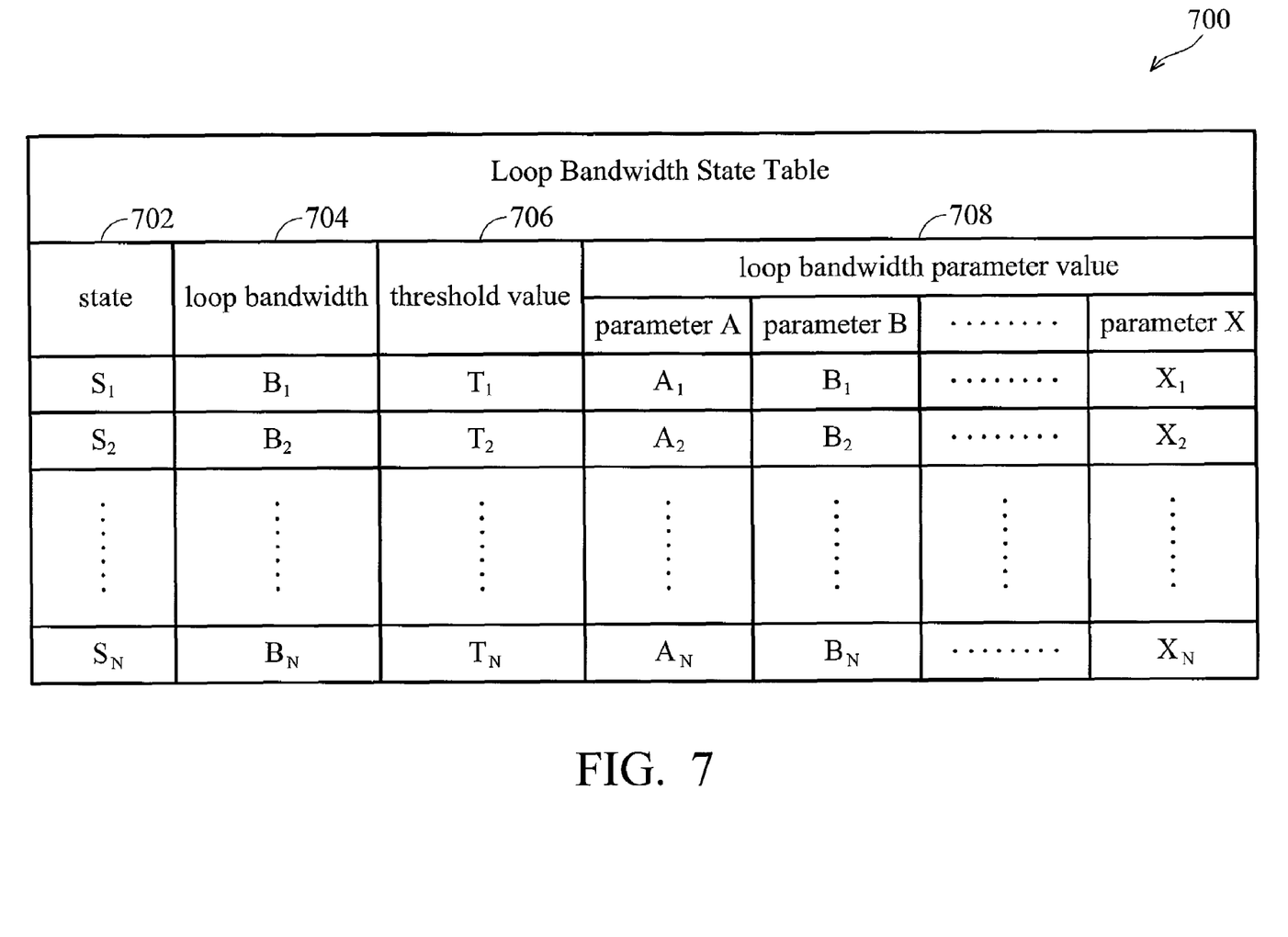
FIG. 7 shows a loop bandwidth state table 700 storing the threshold values and parameter values according to the invention.

The parameter tables 608 stores multiple parameter values of the loop bandwidth parameters corresponding to the multiple states, as shown in the column 708 of loop bandwidth state table 700. FIG. 7 shows a loop bandwidth state table 700 storing the threshold values and parameter values according to the invention. The column 702 shows the multiple states $S_1 \sim S_N$ corresponding to different amounts of loop bandwidth $B_1 \sim B_N$ shown in the column 704. When the parameter table 608 receives the current state information from the state controller 602, the parameter table 608 determines the parameter values of the loop bandwidth parameters corresponding to the current state. For example, if the current state is $S_2$, the parameter table 608 outputs the parameter values $A_2 \sim X_2$ corresponding to loop bandwidth parameters A~X. The loop bandwidth parameters are then set with the parameter values. Because the loop bandwidth parameters control the loop bandwidth of the closed loop control system, the loop bandwidth is thus switched to an appropriate loop bandwidth $B_2$ corresponding to the current state $S_2$. If the multiple states $S_1 \sim S_N$ are sequentially applied to the closed loop control system, the loop bandwidths $B_1 \sim B_N$ corresponding to the states $S_1 \sim S_N$ progressively decrease with the order of the states, such as to progressively level up the importance of the output signal stability and to level down the importance of the convergence speed.

Figure 8:
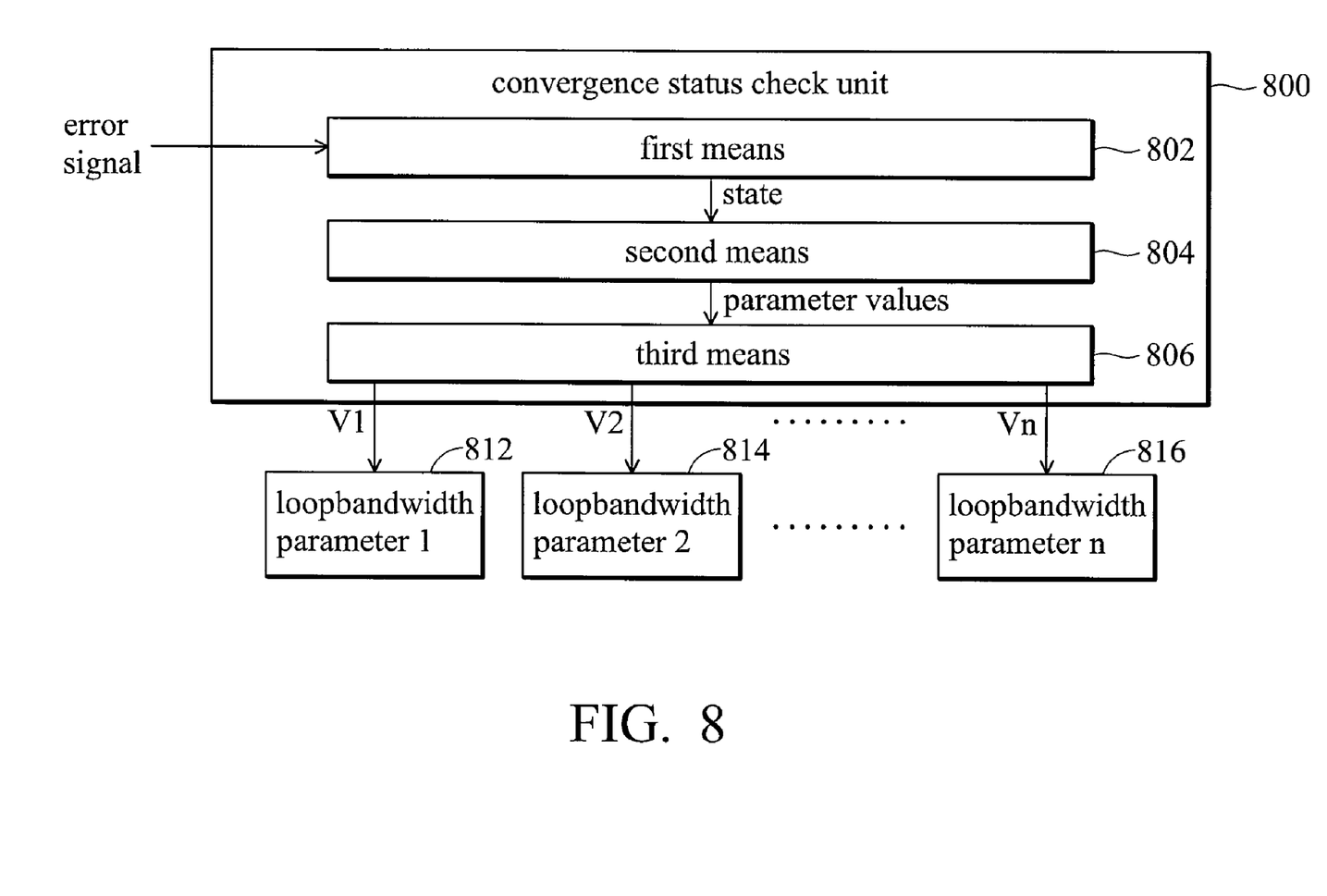
FIG. 8 is a block diagram of a convergence status check unit 800 according to the invention.

FIG. 8 is a block diagram of a convergence status check unit 800 according to the invention. The convergence status check unit 800 comprises a first means 802, a second means 804, and a third means 806. The first means 802 selects an appropriate state from the plurality of states according to the error signal. The second means 804 determines the appropriate values of the at least one loop bandwidth parameter according to the appropriate state. The third means sets the loop bandwidth parameters 812, 814 and 816 with the appropriate values V1, V2 and Vn to switch the loop bandwidth of the closed loop control system to an appropriate loop bandwidth corresponding to the appropriate state. In an embodiment, the first means is the state controller 602, and both the second and the third means are the parameter table 608 of the convergence status check unit 600.

The invention provides a method for dynamically changing the loop bandwidth of a closed loop control system. By introducing the convergence status check unit, the closed loop control system or automatic frequency control mechanism can have both desired convergence characteristics of short setting time (or fast convergence speed) and good output signal stability. Thus, a better performance of the closed loop control system can be achieved when compared with conventional design.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for dynamically changing the loop bandwidth of a closed loop control system, wherein at least one loop bandwidth parameter controls the loop bandwidth of the closed loop control system, a plurality of states corresponding to different amount of loop bandwidth is arranged in advance, and the closed loop control system comprises an error detector and a convergence status check unit, the method comprising:

via the error detector, detecting periodically an error signal reflecting the convergence status of the output signal of the closed loop control system;

via the convergence status check unit, dynamically adjusting the at least one loop bandwidth parameter according to the error signal to change the loop bandwidth of the closed loop control system; and via the convergence status check unit, sequentially applying the plurality of states to the closed loop control system to progressively decrease the loop bandwidth of the closed loop control system with the order of the plurality of states, thus progressively increasing the signal stabilities of the closed loop control system with the order of the plurality of states.

2. The method for dynamically changing the loop bandwidth of a closed loop control system as claimed in claim 1, wherein the closed loop control system further comprises a compensator and a loop filter, and the method further comprises:

via the loop filter, generating a feedback signal of the closed loop control system according to the loop bandwidth; and via the compensator, compensating an input signal of the closed loop control system with the feedback signal to generate the output signal.

3. The method for dynamically changing the loop bandwidth of a closed loop control system as claimed in claim 1, wherein adjusting step comprises:

via the convergence status check unit, selecting an appropriate state from the plurality of states according to the error signal; and via the convergence status check unit, setting the at least one loop bandwidth parameter with the appropriate values to switch the loop bandwidth of the closed loop control system to an appropriate loop bandwidth corresponding to the appropriate state.

4. The method for dynamically changing the loop bandwidth of a closed loop control system as claimed in claim 3, wherein the plurality of states includes an acquisition state corresponding to larger loop bandwidth and faster convergence speed and a tracking state corresponding to smaller loop bandwidth and higher signal stability.

5. The method for dynamically changing the loop bandwidth of a closed loop control system as claimed in claim 3, wherein the appropriate state is determined through comparing the error signal with a plurality of threshold values corresponding to the plurality of states in the selecting step.

6. The method for dynamically changing the loop bandwidth of a closed loop control system as claimed in claim 1, wherein the closed loop control system performs a phase locked loop, and the error signal is a phase error.

7. The method for dynamically changing the loop bandwidth of a closed loop control system as claimed in claim 1, wherein the closed loop control system performs a frequency locked loop, and the error signal is a frequency error.

8. The method for dynamically changing the loop bandwidth of a closed loop control system as claimed in claim 2, further comprising loop filtering, in proportional integration type, the error signal to generate the feedback signal, wherein the at least one loop bandwidth parameter comprising a proportional parameter and an integrated parameter of the loop filtering.

9. The method for dynamically changing the loop bandwidth of a closed loop control system as claimed in claim 7, wherein the detecting further comprising a first and a second integrating and dumping (I&D) for controlling coherent and non-coherent length of the output, and the at least one loop bandwidth parameter comprises a coherent and a non-coherent length of the first and second (I&D).

10. A closed loop control system, wherein at least one loop bandwidth parameter controls a loop bandwidth of the closed loop control system, and a plurality of states corresponding to different amount of loop bandwidth is arranged in advance, the closed loop control system comprising:

an error detector, for periodically detecting an error signal reflecting the convergence status of the output signal of the closed loop control system;

a loop filter, coupled to the error detector, for filtering the error signal to generate a feedback signal of the closed loop control system according to a loop bandwidth;

a compensator, coupled to the loop filter, for compensating an input signal of the closed loop control system with the feedback signal to generate the output signal; and a convergence status check unit, coupled to the error detector and the loop filter, for dynamically adjusting at least one loop bandwidth parameter according to the error signal to change the loop bandwidth of the closed loop control system, sequentially applying the plurality of states to the closed loop control system to progressively decrease the loop bandwidth of the closed loop control system with the order of the plurality of states, thus progressively increasing the signal stabilities of the closed loop control system with the order of the plurality of states.

11. The closed loop control system as claimed in claim 10, wherein the convergence status check unit further comprising:

means for selecting an appropriate state from the plurality of states according to the error signal;

means for determining the appropriate values of the at least one loop bandwidth parameter according to the appropriate state; and means for setting the at least one loop bandwidth parameter with the appropriate values to switch the loop bandwidth of the closed loop control system to an appropriate loop bandwidth corresponding to the appropriate state.

12. The closed loop control system as claimed in claim 10, wherein the plurality of states includes an acquisition state corresponding to larger loop bandwidth and faster convergence speed and an tracking state corresponding to smaller loop bandwidth and higher signal stability.

13. The closed loop control system as claimed in claim 11, wherein means for determining the appropriate state through comparing the error signal with a plurality of threshold values corresponding to the plurality of states.

14. The closed loop control system as claimed in claim 10, wherein the closed loop control system performs a phase locked loop, and the error signal is a phase error.

15. The closed loop control system as claimed in claim 10, wherein the closed loop control system performs a frequency locked loop, and the error signal is a frequency error.

16. The closed loop control system as claimed in claim 10, wherein the loop filter comprising a proportional-integration (PI) filter, and the at least one loop bandwidth parameter comprises a proportional parameter and an integrated parameter of the loop filter.

17. The closed loop control system as claimed in claim 10, wherein the error detector comprising a frequency discriminator, and the at least one loop bandwidth parameter comprises a coherent length of a first integrate and dump (I&D)

module of the frequency discriminator, and a non-coherent length of a second integrate and dump (I&D) module of the frequency discriminator.

18. A convergence status check unit for dynamically adjusting a loop bandwidth of a closed loop control system, wherein a plurality of states corresponding to different amount of loop bandwidth is arranged in advance, the convergence status check unit comprising:

a state controller, for selecting an appropriate state from the plurality of states of the closed loop control system according to an error signal reflecting the convergence status of the output signal of the closed loop control system, and sequentially applying the plurality of states to the closed loop control system to progressively decrease the loop bandwidth of the closed loop control system with the order of the plurality of states; and a parameter table, coupled to the state controller, for determining appropriate values of at least one loop bandwidth parameter according to the appropriate state, wherein the at least one loop bandwidth parameter controls the loop bandwidth;

wherein the at least one loop bandwidth parameter is then set with the appropriate values to switch the loop bandwidth of the closed loop control system to an appropriate loop bandwidth corresponding to the appropriate state.

19. The convergence status check unit as claimed in claim 18, wherein the plurality of states includes an acquisition state corresponding to larger loop bandwidth and faster convergence speed and an tracking state corresponding to smaller loop bandwidth and higher signal stability.

20. The convergence status check unit as claimed in claim 18, wherein the convergence status check unit further comprises:

a sampling variance calculator, for calculating the variance of the error signal;

a threshold value table, coupled to the state controller, for determining a threshold value corresponding to the appropriate state; and a comparator, coupled to the sampling variance calculator and the threshold value table, for comparing the variance with the threshold value to generate a comparison result;

wherein the state controller determines the appropriate state according to the comparison result.

21. The convergence status check unit as claimed in claim 18, wherein the closed loop control system comprising an error detector for detecting the error signal, a loop filter for generating a feedback signal of the closed loop control system according to the loop bandwidth, and a compensator for compensating an input signal of the closed loop control system with the feedback signal to generate the output signal.

22. The convergence status check unit as claimed in claim 21, wherein the loop filter comprising a proportional-integration (PI) filter, and the at least one loop bandwidth parameter comprises a proportional parameter and a integrate parameter of the loop filter.

23. The convergence status check unit as claimed in claim 21, wherein the error detector comprising a frequency discriminator, and the at least one loop bandwidth parameter comprises a coherent length of a first integrate and dump (I&D) module of the frequency discriminator, and a non-coherent length of a second integrate and dump (I&D) module of the frequency discriminator.

* * * * *